United States Patent [19]
Kojima

[11] Patent Number: 5,789,777
[45] Date of Patent: Aug. 4, 1998

[54] NON-VOLATILE MEMORY HAVING MULTI-BIT DATA CELLS WITH DOUBLE LAYERED FLOATING GATE STRUCTURE

[75] Inventor: Toshiaki Kojima, Sendai, Japan

[73] Assignee: Motorola, Inc., Schaumburg, Ill.

[21] Appl. No.: 778,410

[22] Filed: Jan. 2, 1997

[30] Foreign Application Priority Data

Feb. 19, 1996 [JP] Japan ................................... 8-030779

[51] Int. Cl.⁶ ................................................... H01L 29/76
[52] U.S. Cl. .......................... 257/314; 257/315; 257/316; 257/319; 257/320; 257/321; 257/365; 365/185.03; 365/185.1; 365/185.14
[58] Field of Search ....................... 257/314, 315, 257/316, 317, 318, 319, 320, 321, 365; 365/185.03, 185.1, 185.14

[56] References Cited

U.S. PATENT DOCUMENTS

| | | | |
|---|---|---|---|
| 5,111,257 | 5/1992 | Andoh et al. | 357/23.4 |
| 5,282,161 | 1/1994 | Villa | 365/185 |
| 5,517,044 | 5/1996 | Koyama | 257/316 |
| 5,633,518 | 5/1997 | Broze | 257/314 |

Primary Examiner—Sara W. Crane
Assistant Examiner—Douglas A. Wille
Attorney, Agent, or Firm—Rennie William Dover

[57] ABSTRACT

The non-volatile memory has a storage cell complying with multi-bit data by means of a double layered floating gate architecture. The cell comprises: source 2 and drain 3 which are distant from each other along a direction L in a semiconductor substrate 1; a single first floating gate 4A which is provided between the source and the drain and above a principal plane of the semiconductor substrate and extends along a direction crossing the direction L; a control gate 5 which is placed between the drain ad source and above a principal plane of the first floating gate; high impurity concentration layers 21, 22 which are isolated from the source and drain in the semiconductor substrate; a plurality of second floating gates $4B_1$, $4B_2$ which respectively extend across the first floating gate and above a principal plane of the first floating gate and extend from a position different than either of the source and the drain up to a position above a principal plane of the high impurity concentration layer; and a plurality of program gates $6_1$, $6_2$ which are placed correspondingly above principal planes of the second floating gates.

20 Claims, 9 Drawing Sheets

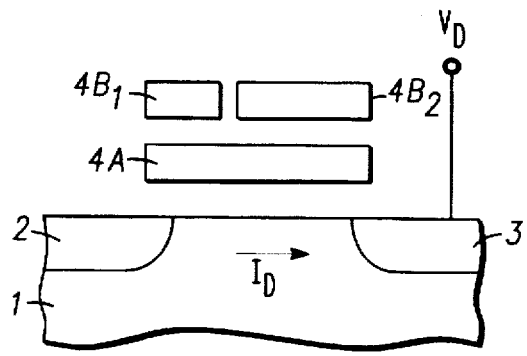
Fig. 4
| STATE OF DRAIN CURRENT / SECOND FLOATING GATE | STATE 1 | STATE 2 | STATE 3 | STATE 4 |
|---|---|---|---|---|
| $4B_1$ | 0 | 0 | 1 | 1 |
| $4B_1$ | 1 | 0 | 1 | 0 |
Fig. 5
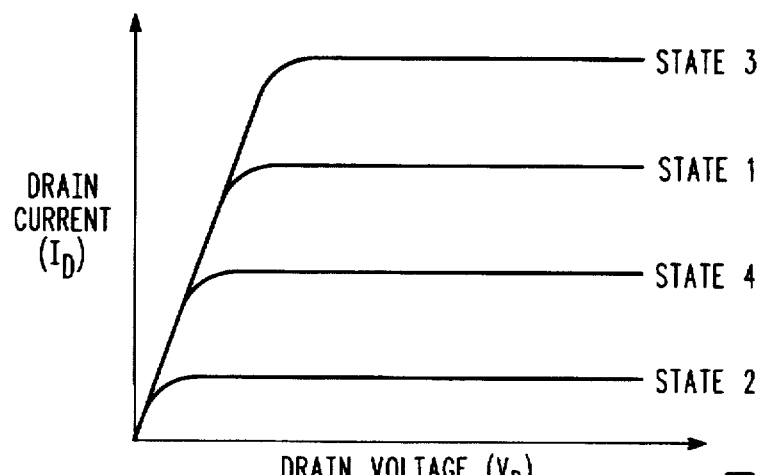
Fig. 6

NON-VOLATILE MEMORY HAVING MULTI-BIT DATA CELLS WITH DOUBLE LAYERED FLOATING GATE STRUCTURE

TECHNICAL FIELD

The present invention relates to a non-volatile memory, and in particular, to a memory in which a storage cell is comprised of a transistor having a floating gate architecture. The invention also relates to a programming, erasing and reading method for the memory.

BACKGROUND OF THE INVENTION

A non-volatile memory comprised of storage cells formed by transistors having floating and control gates is described, for example, in "S. Keeny et al., 'Complete Transient Simulation of Flash $E^2$PROM Devices' IEEE ED-39, No. 12 December 1992". The basic structure of this storage cell is shown in FIG. 1.

In FIG. 1, the storage cell is comprised of a MOS field effect transistor (typically, a so-called SAMOS transistor) having: a source 2 and a drain 3 formed in a substrate 1 made of an impurity semiconductor, such as a p-type silicon; a floating gate 4 disposed along and over a source-drain channel, and surrounded by an insulator such as an oxide; and a control gate 5 formed over the gate 4 with said oxide disposed therebetween. FIG. 1 (a) illustrates how the cell is written or programmed, where when the gate voltage $V_G$ and drain voltage $V_D$ are pulled to a high level, hot electrons are developed, and then stored at the floating gate 4. FIG. 1 (b) shows how the stored information in the cell is erased, where by pulling the source voltage $V_S$ to a high level, the electrons stored at the floating gate 4 are pulled into the source 2, thereby causing holes to be stored at the floating gate 4. As may be seen from FIGS. 1 (a) and (b), by controlling the carriers in the floating gate 4, the information storage state in one cell is produced. For example, a program state and an erase state are assigned to a logic "0" and a logic "1", respectively.

FIG. 2 shows drain current $I_D$ vs. gate voltage $V_G$ characteristics in the program and erase states of the memory cell whose storage state is determined in that way.

However, in such cells, because one cell only assumes two states, and thus may store only binary information (i.e., one bit of binary data), it has a disadvantage that it cannot sufficiently accommodate today's increasing needs for greater memory capacity.

Furthermore, with programming based on hot carrier injection (HCI), very fast programming can be generally achieved, but a large amount of current flows during programming, so power consumption in the cell and memory tends to increase; in addition, trapping of electrons in the oxide film during programming and so forth may probably cause degradation of the oxide film, resulting in reduced lifetime.

On the other hand, a simplified memory fabrication process is important to secure improvement in so-called yield and cost reduction. Thus, there is a need for a memory and cell structure tailored to a simple manufacturing process.

Accordingly, it is an object of the present invention to provide a non-volatile memory that can make a contribution to increased memory capacity, and its programming/erasing/reading method. It is another object of the present invention to provide a non-volatile memory that can be tailored to a simple fabrication process and its programming/erasing/reading method.

SUMMARY OF THE INVENTION

A non-volatile memory having a cell complying with multi-bit data by means of a double layered floating gate architecture according to the present invention comprises:

source and drain being distant from each other along a predetermined arrangement direction in a semiconductor substrate;

a single first floating gate being provided between said source and said drain and above a principal plane of said semiconductor substrate and extending along a direction crossing said predetermined arrangement direction;

a control gate being placed between said drain and said source and above a principal plane of said first floating gate;

at least one high impurity concentration layer being isolated from said source and drain in said semiconductor substrate;

a plurality of second floating gates which respectively extend across said first floating gate and above the principal plane of said first floating gate and extend from a position different than either of said source and said drain up to a position above a principal plane of said high impurity concentration layer; and a plurality of program gates being placed correspondingly above principal planes of said second floating gates.

With this non-volatile memory, a reading transistor block is formed by said source and drain, said first floating gate, and said control gate, and programming and erasing blocks are formed by said high impurity concentration layers, said second floating gates, and said program gates.

A programming method according to the present invention comprises a method for programming information into said non-volatile memory, said method characterized by: applying a predetermined program voltage between said program gate corresponding to said second floating gate to be programmed with information and said high impurity concentration layer, and tunneling electrons generated thereby from said high impurity concentration layer into an intermediate material between said high impurity concentration layer and said program gate, thereby injecting them into said second floating gate.

An erasing method according to the present invention comprises a method for erasing the information programmed into said non-volatile memory, said method characterized by: applying a predetermined erase voltage between said program gate corresponding to said second floating gate from which the information is to be erased and said high impurity concentration layer, and tunneling electrons generated thereby from said second floating gate into an intermediate material between said high impurity concentration layer and said program gate, thereby injecting them into said high impurity concentration layer.

A reading method according to the present invention comprises a method for reading the information programmed into said non-volatile memory, said method characterized by: applying a predetermined bias voltage to said control gate to detect a channel current generated between said source and said drain.

With the non-volatile memory having a cell applying to multi-bit data by means of a double layered floating gate architecture according to the present invention, and its programming/erasing method, carriers corresponding to data bits are stored respectively on said second floating gates, and the first floating gate determines a drain current threshold in accordance with the sum of carriers stored on all the second floating gates. With the reading method according to the present invention, the transistor section comprised of a source and drain, a first floating gate and a control gate serves to provide an independent reading function. With the programming/erasing method according to the present invention, the block formed by a high impurity concentration layer defined separately from the source and drain, a second floating gate extended therealong, and a program gate corresponding thereto serves to provide independent programming/erasing functions, while carriers are stored and controlled between the high impurity concentration layer and second floating gate due to tunneling therebetween.

BRIEF DESCRIPTION OF THE DRAWINGS

FIG. 4 is a cross-sectional view depicting the structure of the storage cell based on the structure of FIG. 3, where two second floating gates are used;

FIG. 5 is a table showing storage states of the storage cell;

FIG. 6 is a drain current $I_D$ vs. drain voltage $V_D$ characteristics chart in various storage states in the table of FIG. 5;

DETAILED DESCRIPTION OF THE PREFERRED EMBODIMENT

The present invention is described in detail below with reference to the accompanying drawings.

Figure 1A:
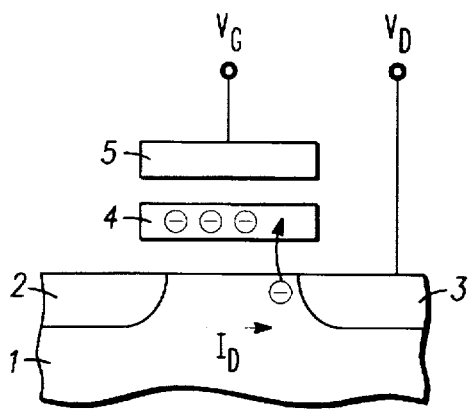
FIG. 1 is a cross-sectional view depicting the basic structure of a storage cell formed by a transistor having floating and control gates.
Figure 1B:
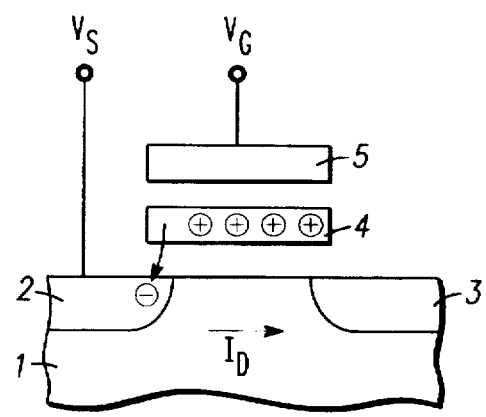
Figure 2:
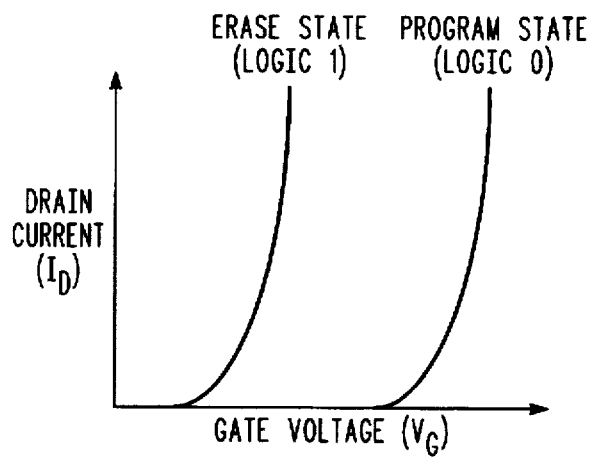
FIG. 2 is a drain current $I_D$ vs. gate voltage $V_G$ characteristics chart in program and erase states of the memory cell of FIG. 1.
Figure 3:
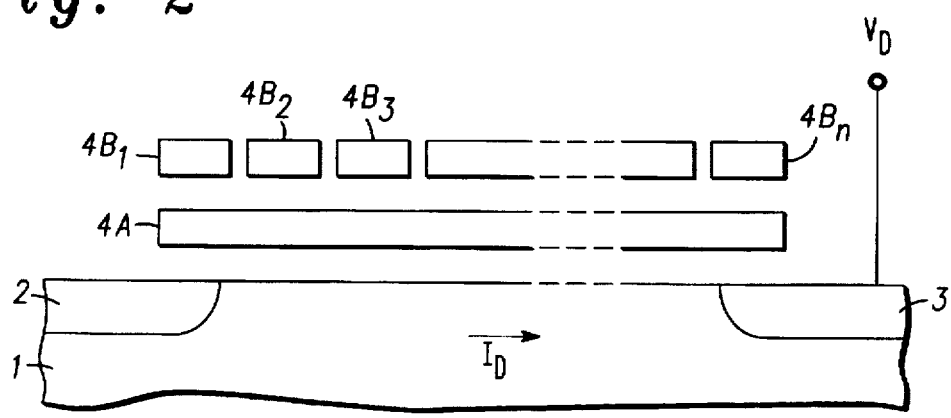
FIG. 3 is a cross-sectional view depicting the basic structure of a storage cell of a non-volatile memory according to the present invention.

FIG. 3 shows a basic storage cell architecture of a non-volatile memory according to the present invention, where like reference symbols denote like parts of FIG. 1.

In FIG. 3, the transistor of such a memory cell includes: a source 2 and a drain 3 of high impurity concentration layers formed on a substrate 1 made of an impurity semiconductor, such as a p-type silicon; a first floating gate 4A disposed along and over a channel between the source and drain (or stacked thereover) and surrounded by an oxide; and at least two second floating gates $4B_x$ (where x=1, 2, 3, ..., n) formed over the longitudinal gate 4A (or stacked thereover) and disposed distally with respect to each other, said at least two second floating gates being surrounded by the oxide. The first and second floating gates are formed of polysilicon, for example, and surrounded by $SiO_2$.

The second floating gates are individually charged with electrons (or holes), or programmed with information, by a programming technique described later, while the electrons (holes) charged are discharged, or the information is erased, by a predetermined erasing method such as a ultraviolet ray irradiation-based erasing technique. As may be apparent later, the carriers charged on each of the second floating gates control the level of drain current $I_D$. Thus, by individually corresponding each of the second floating gate with a bit of data to be stored and charging carriers to the second floating gate in accordance with that bit of data, the same number of bits of data as the number of second floating gates may be stored.

FIG. 4 may be used to clearly explain this in greater detail. FIG. 4 shows the storage cell architecture based on the architecture of FIG. 3, where there are two second floating gates, with like reference symbols denoting like parts of FIG. 3.

In FIG. 4, the second floating gate $4B_1$ close to the source 2 is formed with a smaller effective area for storing carriers on a plane facing the first floating gate and on its opposite plane, than the second floating gate $4B_2$ close to the drain 3. With both of these floating gates, the amount of chargeable carriers is set according to their effective areas. As shown in FIG. 5, assuming that a holes-charged state and neutral state between the gates $4B_1$ and $4B_2$ is assigned a logic "1", whereas an electrons-charged state is assigned a logic "0", then four possible states are obtained for this cell.

The resulting drain current $I_D$ vs. drain voltage $V_D$ characteristics are shown in FIG. 6. This indicates that four drain current values obtained with respect to the drain voltage are all different from each other; the effective area of the second floating gate $4B_2$ is greater than that of $4B_1$ by a predetermined value, so the drain current values drop in order of reference numerals 3, 1, 4, and 2 indicative of the drain current states in the table of FIG. 5; thus, four kinds of storage states are obtained for one cell. Likewise, by making the effective areas of n second floating gates in FIG. 3 different from each other, $2^n$ kinds of storage states could be obtained.

Such states may be further analyzed as follows.

Figure 7:
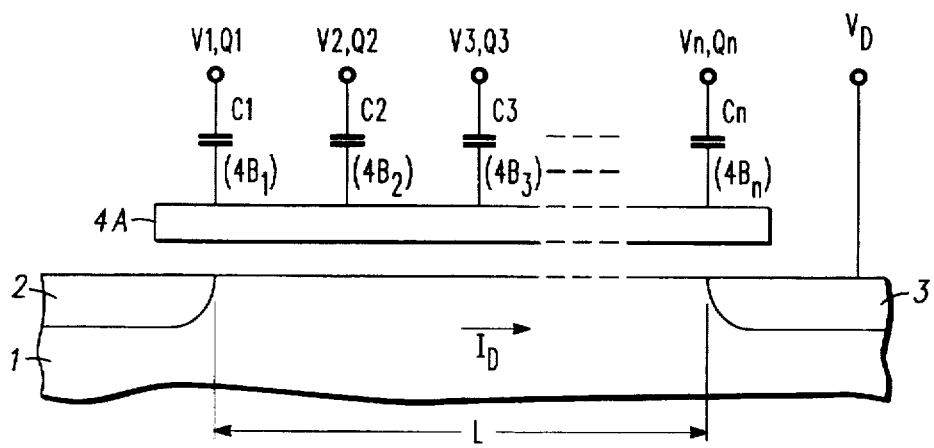
FIG. 7 is a diagram illustrating an equivalent circuit of the storage cell of FIG. 3.

First of all, an equivalent circuit of the storage cell of FIG. 3 is shown in FIG. 7. With this equivalent circuit, each of the oxides between the second floating gate (FG2) and the first floating gate 4A may be replaced by capacitance $C_x$ (where x=1, 2, ..., n) having a voltage $V_x$ and a charge $Q_x$; in addition, one end of the capacitance is commonly connected at the first floating gate 4A (FG1), a source-drain channel of the substrate 1 and the first floating gate 4A are connected through a capacitance $C_0$ having a voltage $V_0$ and a charge $Q_0$.

In such an equivalent circuit, the total amount of charges stored on all the second floating gates, $Q_{FG2}$, is expressed as:

[Equation 1]

$$Q_{FG2} = \sum_{i=1}^{n} Q_i = \sum_{i=1}^{n} C_i(V_i - V_0) \quad (1)$$

The total amount of charges stored on the first floating gate 4A, $Q_0$, is given by:

[Equation 2]

$$Q_0 = C_0(V_0 - V_{sub}) \quad (2)$$

where $V_{sub}$ is a potential at the semiconductor substrate 1. According to conservation of charge,

[Equation 3]

$$Q_{FG2} = Q_0 \quad (3)$$

So, the voltage at the first floating gate 4A is defined by:
[Equation 4]

$$V_0 = \left( \sum_{i=0}^{n} C_i V_i + C_0 V_{sub} \right) / \sum_{i=0}^{n} C_i \quad (4)$$

When the drain current is in its threshold state where it turns on (rises), the source-drain surface potential of the substrate 1 changes to $2f_f$ (where $f_f$ is a difference between energy $E_i$ at the center of the forbidden band and Fermi level $E_F$) (thus, $V_{sub} = 2f_f$), so the threshold voltage $Vth_{FG1}$ of the first floating gate may be expressed as:

[Equation 5]

$$Vth_{FG1} = \left( \sum_{i=0}^{n} C_i V_i + C_0 \cdot 2\Delta_f \right) / \sum_{i=0}^{n} C_i \quad (5)$$

Then, $Q_0$ is equal to the charge $Q_{dep}$ in the depletion mode, so the following relationships are met:

[Equation 6]

$$C_0(Vth_{FG1} - 2\Delta_f) = \sqrt{2e_s q N_{sub} \cdot 2\Delta_f} \quad (6)$$

$$Vth_{FG1} = 2\Delta_f + \sqrt{2e_s q N_{sub} \cdot 2\Delta_f} / C_0 \quad (7)$$

where:

$e_S$ is a dielectric constant of semiconductor substrate 1;

q is a raw charge amount of electrons; and $N_{sub}$ is an impurity concentration of semiconductor substrate 1.

With the drain current in its on state, $V_0 > Vth_{FG1}$, and the voltage at the first floating gate 4A is given by:
[Equation 7]

$$V_{FG1} > 2\Delta_f + \sqrt{2e_s q N_{sub} \cdot 2\Delta_f} / C_0 \quad (8)$$

The drift channel current may be expressed as:
[Equation 8]

$$I_D = m Q_N E \quad (9)$$

where:

m is electron mobility; and

E is a channel's lateral field.

$Q_N$, which represents the charge in the inverting layer, may be written as:

[Equation 9]

$$Q_N = C_0(V_0 - Vth_{FG1} - V) \quad (10)$$

where V is a channel voltage.
[Equation 10]

$$I_D = m W C_0 \{V_0 - Vth_{FG1} - V\} \cdot (dV/dy) \quad (11)$$

where:

W is a channel width; and dy is a channel direction differential length.

Integrating the channel current from the source to the drain yields:

[Equation 11]

$$\int_0^L I_D dy = \int_0^{V_D} \mu W C_0 (V_0 - Vth_{FG1} - V) dV \quad (12)$$

where L is an effective channel length.
[Equation 12]

$$I_D = (W/L) \cdot m C_0 \{(V_0 - Vth_{FG1}) V_D - 0.5 V_D^2\} \quad (13)$$

Thus, as may be clear from Eq. (5), the threshold voltage of the first floating gate for conducting a drain current is determined by the sum of charges stored at the second floating gates. In other words, the first floating gate serves to determine, indirectly, the operation of the cell transistor according to the sum of charges stored at all the second floating gates. In addition, the presence of the first floating gate 4A enables a single cell transistor to handle different threshold voltages. Furthermore, because summing of charges, i.e., summing of signals is done through capacitive coupling (electrostatic coupling) in the voltage mode, charge itself need not be moved, so the power required for that summation is equal to zero (0). In the example of FIG. 4, by making the effective areas of the second floating gates different from each other and varying the carrier storage amounts, i.e., values of capacitances $C_1$ and $C_2$, at each gate to perform so-called weighting, four summation results are obtained. Likewise, by making the effective areas of n second floating gates in FIG. 3 different from each other, 2n kinds of storage states could be obtained.

On the other hand, if the second floating gates $4B_1$ and $4B_2$ are formed with the same area of their principal planes, and electrons are injected into each of the second floating gates with an equal bias, then equivalent drain current values would be obtained for states 1 and 4 of the drain current shown in FIG. 5, so only three kinds of states could be obtained for one cell; even in this case, there is an advantage in that three or more states could be produced for one cell. It is necessary, however, to account for the fact that only three storage states could be obtained for two data bits of input.

Figure 8:
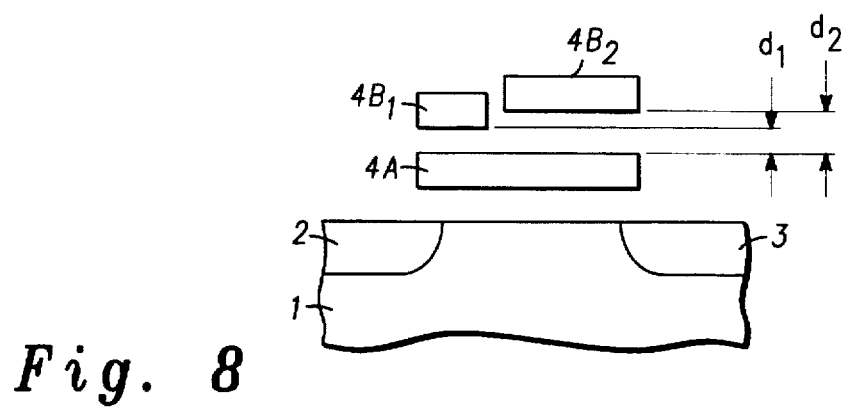
FIG. 8 is a cross-sectional view depicting an alternate embodiment of the structure of FIG. 4.

FIG. 8 shows an alternate embodiment of the cell architecture of FIG. 4, where for each of the second floating gates, their effective areas described above are made equal to each other, and the distance from the other second floating gate $4B_2$ to the first floating gate 4A is set longer than that from one second floating gate $4B_1$ to the first floating gate 4A. In other words, $d_1<d_2$. Even with such an architecture, because the carrier storage capacities of the second floating gates are different, four storage states can be produced as described in FIGS. 5 and 6. Similarly, by making the distances of n second floating gates in FIG. 3 with respect to the first floating gate 4A different from each other, values of capacitances $C_1$ through $C_n$ in the equivalent circuit of FIG. 7 may be made different, thereby producing $2^n$ types of storage states.

It should be appreciated that values of capacitances $C_1$ through $C_n$ are dependent not only upon their electrode areas, i.e., the facing areas of the gates, and the gap between the electrodes, i.e., each gate-to-gate distance, but also upon characteristics of intermediate material between the gates. Therefore, when fabricating the storage cell, either of the parameters that determine those capacitance values may be set to a desired level. Further, as shown in FIG. 6 above, in order that drain current characteristics are different from each other for each of the storage states, values of $C_1$ through $C_n$, as well as values of $Q_1$ through $Q_n$, may be set so that $2^{n-1}$ kinds of $Vth_{FG1}$ values are obtained. Values of $Q_1$ through $Q_n$ are determined by each injection energy at the time when electrons are injected into each second floating gate during programming.

It has been described so far that a plurality of second floating gates stacked with a single first floating gate disposed therebetween and having an appropriate size (i.e., carrier storage capacity) are provided in a single cell, and carriers corresponding to each bit of data may be stored thereon, whereby a single cell can assume multiple data bits; below is described a specific carrier storage method, that is, a programming/erasing and reading method.

Figure 9:
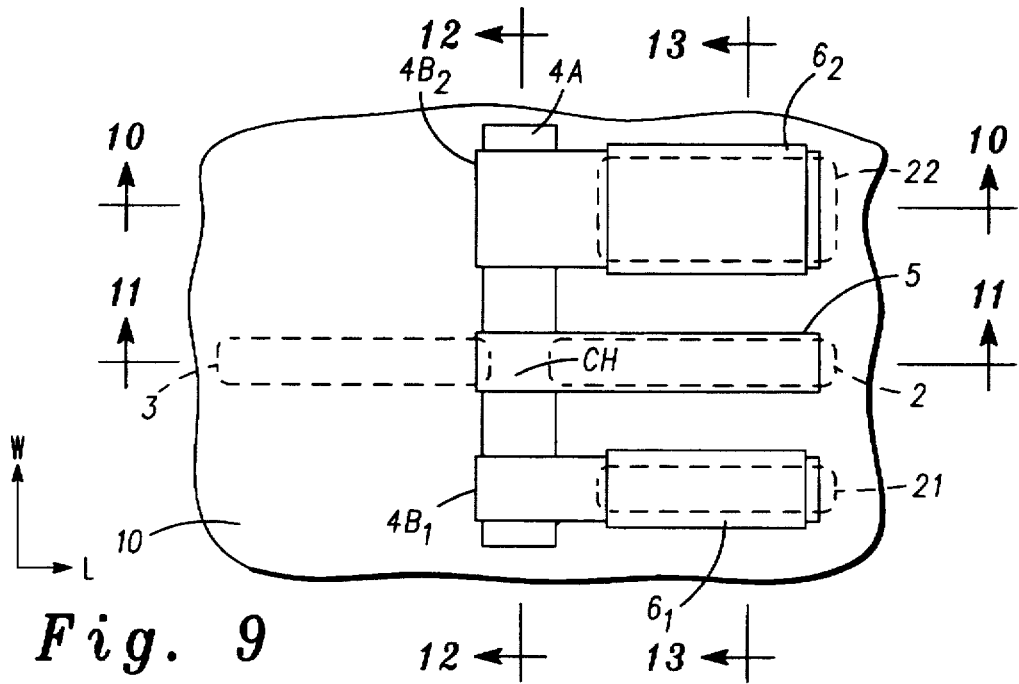
FIG. 9 is a plane view illustrating the structure of the storage cell based on the structure of FIG. 4 according to one embodiment of the present invention, wherein carriers are stored and controlled at each of the second floating gates by use of FN tunneling.
Figure 10:
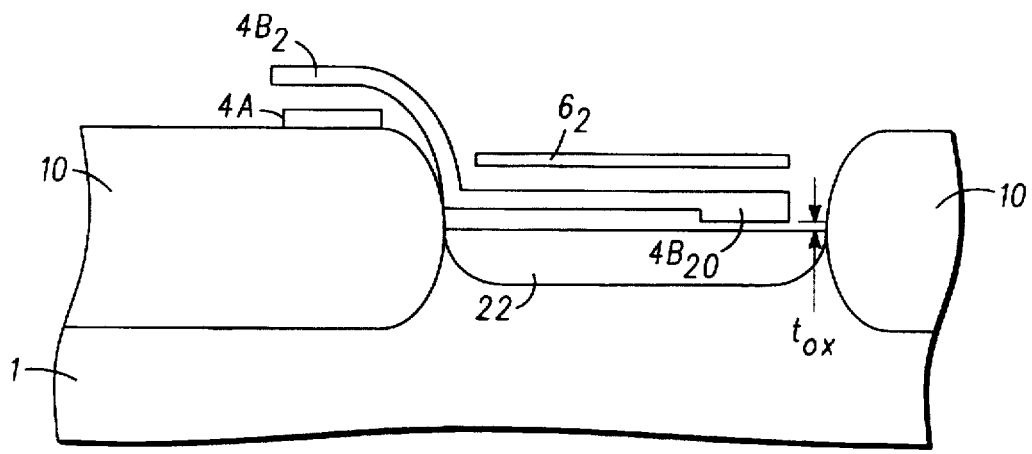
FIG. 10 is a cross-sectional view along $X_1$—$X_1$ of the storage cell of FIG. 9.
Figure 11:
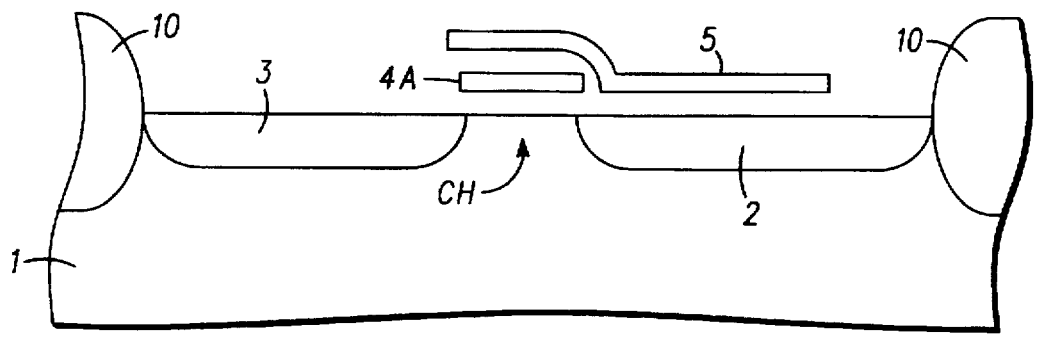
FIG. 11 is a cross-sectional view along $X_2$—$X_2$ of the storage cell of FIG. 9.
Figure 12:
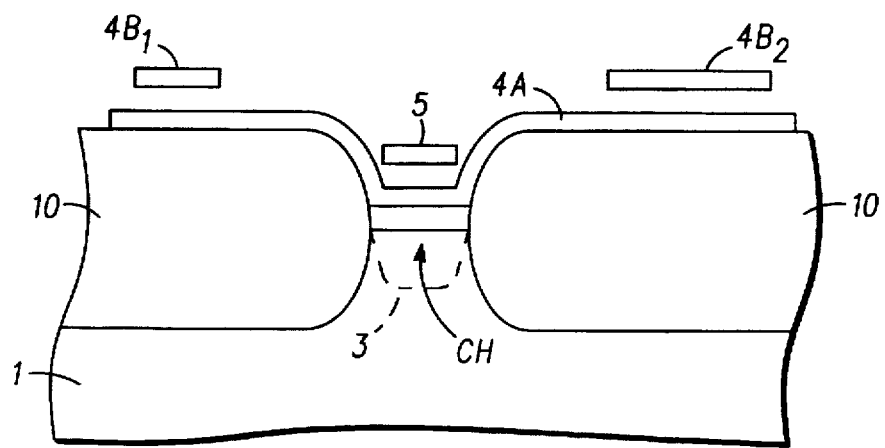
FIG. 12 is a cross-sectional view along $Y_1$—$Y_1$ of the storage cell of FIG. 9.
Figure 13:
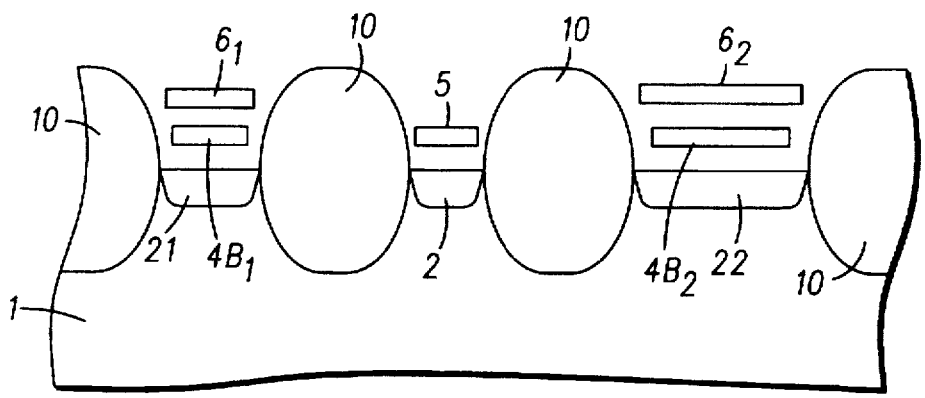
FIG. 13 is a cross-sectional view along $Y_2$—$Y_2$ of the storage cell of FIG. 9.

FIG. 9 is plane view illustrating the storage cell architecture where so-called Fowler-Nordheim tunneling (hereinafter referred to as "FN tunneling") between a substrate and a polysilicon layer is used to program two second floating gates; FIG. 10 is a cross-sectional view along $X_1$—$X_1$ thereof; FIG. 11 is a cross-sectional view along $X_2$—$X_2$ thereof; FIG. 12 is a cross-sectional view along $Y_1$—$Y_1$ thereof; and FIG. 13 is a cross-sectional view along $Y_2$—$Y_2$ thereof. In those figures, like parts equivalent to those shown in FIG. 4 are denoted by the same reference symbols.

In FIGS. 9–13, a single storage cell has a pair of a source 2 and a drain 3 for forming a read-only transistor in a area assigned to and defined for that cell. The source 2 and drain 3, which are high impurity concentration layers (e.g., $n^+$), respectively, formed distally with respect to each other along a predetermined arrangement direction L in the semiconductor substrate 1. The source 2 and drain 3 are disposed in such a position that the area so defined is divided approximately by half in the direction W perpendicular to the arrangement direction L. Thus, a channel region CH formed between the source 2 and drain 3 is located approximately at the center of that defined area.

At two locations that sandwich the source 2 of the substrate 1 along the direction W are also formed high impurity concentration layers 21 and 22 equivalent in nature to the source 2 and drain 3. These high impurity concentration layers are used for programming and erasing.

Also on the substrate 1, an insulation layer 10 (i.e., field, which is denoted by a shaded portion) made of an electrical insulator and having a predetermined thickness is generally formed, excluding the source 2, drain 3, programming and erasing high impurity concentration layers 21 and 22, and channel region CH.

A first floating gate 4A made of polysilicon surrounded by an oxide, such as, for example, $SiO_2$, is formed in a longitudinal form extending along the direction W, and arranged so that it crosses the channel region CH on the overlying layer relative to the substrate 1. More specifically, the first floating gate 4A extends along the surface of the field 10 and channel region CH, passes above the field 10 and channel region CH in the direction W, and then extends up to the field 10. Thus, the first floating gate 4A has a dent at a location facing the channel region CH, as seen from FIG. 12.

On the overlying layer of the first floating gate 4A relative to the substrate 1, there are disposed second floating gates $4B_1$ and $4B_2$ made of polysilicon surrounded by an oxide such as, for example, $SiO_2$. The second floating gates $4B_1$ and $4B_2$ are disposed distally with respect to each other, and formed in such a manner that they orthogonally cross the first floating gate 4A via the oxide and also in a longitudinal form that extends up to most of the portion above the principal surface of the high impurity concentration layers 21 and 22 along direction L. The second floating gates $4B_1$ and $4B_2$ are also formed in such a manner that they are adjacent to the substrate 1 (high impurity concentration layer 22), excluding areas where they generally overlap the first floating gate 4A and field 10 in the thickness direction. Thus, the second floating gates $4B_1$ and $4B_2$ partially overlap the first floating gate 4A and field 10 at approximately half surface of one end of the direction L, while they overlap the high impurity concentration layer 22 at approximately half surface of the other end, as may be seen from FIG. 10. With these gates $4B_1$ and $4B_2$, their effective areas as described in conjunction with FIG. 4 are set by the width in the direction W.

At the end on the high impurity concentration layer 22 side of the second floating gate $4B_2$, a tunnel oxide film forming region $4B_{20}$ is formed for providing a predetermined short distance $t_{ox}$ relative to the surface of the high impurity concentration layer 22, as shown in FIG. 10. At the tunnel oxide film forming region $4B_{20}$, programming and erasing through FN tunneling described later is achieved. Likewise for the second floating gate $4B_1$, a tunnel oxide film forming region $4B_{10}$ is formed at the end on its high impurity concentration layer 21 side.

A polysilicon gate (hereinafter referred to as a control gate) 5 is further disposed, similarly via an oxide, on the overlying layer of the first floating gate 4A with respect to the substrate 1. The control gate 5 is formed in a longitudinal shape that crosses orthogonally to the first floating gate via the oxide, and extends along the direction L near from the end of the drain 3 on the plane view. The control gate 5 is also formed so that it is adjacent to the substrate 1 (source 2) by an approximately equal distance with respect to the layer of the gate 4A, excluding its portion overlapping the first floating gate 4A in the thickness direction.

On the high impurity concentration layers 21 and 22 side of the second floating gates $4B_1$ and $4B_2$, are stacked polysilicon gates (hereinafter referred to as program gates) $6_1$ and $6_2$, similarly via the oxide. More specifically, the program gates $6_1$ and $6_2$ extend near from the tunnel oxide film forming regions $4B_{10}$ and $4B_{20}$ of the second floating gates $4B_1$ and $4B_2$, to near the end of the high impurity concentration layers 21 and 22 that is close to the first floating gate 4A, and also formed, with a width equivalent to that of the second floating gates $4B_1$ and $4B_2$ along the direction W, over the second floating gates $4B_1$ and $4B_2$.

The fields 10 electrically isolate the pair of high impurity concentration layers used for reading, which comprise the source 2 and drain 3, the high impurity concentration layer 21 used for programming and erasing that corresponds to one bit, and the high impurity concentration layer 22 used for programming and erasing that correspond to the other bit. More specifically, the fields 10 are formed so that the source 2, drain 3 and channel region CH, as well as the a portion of the first floating gate 4A assigned thereto and the control gate 5, are surrounded as a reading portion (see FIGS. 11 and 13 in particular), and also formed so that the high impurity concentration regions 21 and 22, portions of the second floating gates $4B_1$ and $4B_2$ assigned thereto, and the program gates $6_1$ and $6_2$ are surrounded as individual programming and erasing portions corresponding to one and the other bits, respectively (see FIGS. 10 and 13 in particular).

In other words, the second floating gate $4B_1$ in conjunction with the program gate $6_1$ and high impurity concentration layer 21, and the second floating gate $4B_2$ in conjunction with the program gate $6_2$ and high impurity concentration layer 22, form a pair of one-bit application blocks for independent programming and erasing; the first floating gate $4B_1$ in conjunction with the source 2, drain 3, and control gate 5 form a transistor for independent reading.

Figure 14A:
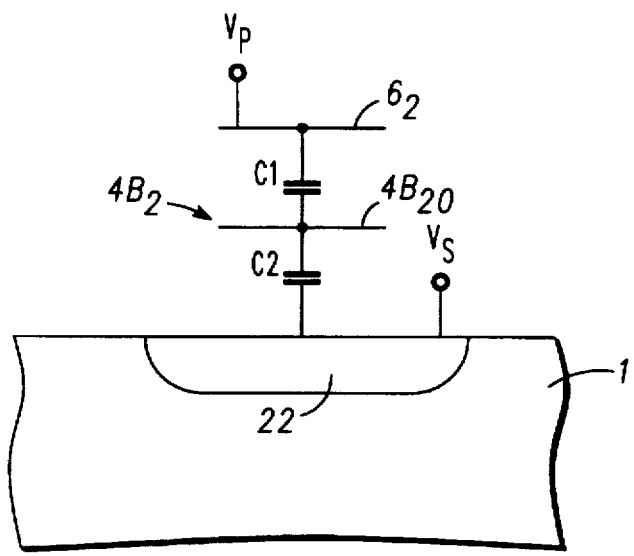
FIG. 14 is an equivalent circuit diagram of a one-bit application block for program/erasure of the storage cell of FIG. 9.
Figure 14B:
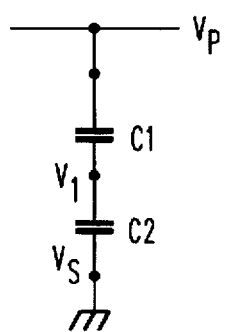
Figure 14C:
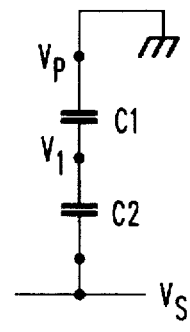

FIG. 14 shows an equivalent circuit of the one-bit application block (FIG. 10) associated with the high impurity concentration layer 22.

As shown in FIG. 14 (A), the oxide between the program gate $6_2$ and second floating gate $4B_2$ (tunnel oxide film forming region $4B_{20}$) may be replaced by a capacitance $C_1$; the oxide between the first floating gate $4B_2$ (tunnel oxide film forming region $4B_{20}$) and high impurity concentration layer 22 may be replaced by a capacitance $C_2$. Its versions modified for each mode are shown in the circuit diagrams of FIGS. 14 (B) and (C).

Here, the amount of charge stored on the second floating gate $4B_1$ is determined by the coupling of each capacitance. For example, the value of capacitance $C_2$ is approximately determined by the thickness $t_{ox}$ of the oxide as shown in FIG. 10 and the electrode area which forms that capacitance, i.e., an overlapping area along the thickness direction of the first floating gate $4B_2$ and high impurity concentration layer 22. Thus, by setting this thickness or area while varying it for each second floating gate, weighting described in conjunction with FIGS. 4 and 8 may be done. In addition, weighting may also be performed by varying the values of capacitance $C_1$ and so on.

With the block that forms such an equivalent circuit, in the program mode, a predetermined high voltage $V_p$ is applied to the program gate $6_2$ and the high impurity concentration layer 22 is grounded to provide a predetermined program voltage, as shown in FIG. 14 (B). This causes FN tunneling between the tunnel oxide film forming region $4B_{20}$ and its corresponding high impurity concentration layer 22, so that electrons from the high impurity concentration layer 22 are injected through the tunnel oxide film into the second floating gate $4B_2$. In the program mode for the second floating gate $4B_1$, the program gate $6_1$ and high impurity concentration layer 21 may be similarly used.

It should be noted that electrons generated during program execution for one of the second floating gates are difficult to be injected into the other of the second floating gates. In other words, the high impurity concentration layers 21 and 22 that generate electrons are independent of each other; in addition, for the high impurity concentration layers, external movement of carriers is blocked by the insulation layer 10, so the breakdown strength for each of the second floating gates is improved, thereby allowing for minimized leakage current developed during programming.

In the erase mode, not only ultraviolet-ray erasure, but also electrical erasure with FN tunneling, just like in the program mode, can be done. For this electrical erasure, a predetermined high voltage $V_S$ is applied to the high impurity concentration layer 22 and the program gate $6_2$ is grounded to provide a predetermined erasure voltage, as shown in FIG. 14 (C). This causes FN tunneling between the tunnel oxide film forming region $4B_{20}$ and its corresponding high impurity concentration layer 22, so that the electrons injected into the second floating gate $4B_2$ are passed through the tunnel oxide film and pulled out toward the high impurity concentration layer 22. In the erase mode for the second floating gate $4B_1$, the program gate $6_1$ and high impurity concentration layer 21 may be similarly used.

The potential $V_1$ of the second floating gate $4B_2$ ($4B_1$) is given by:

[Equation 13]

For programming:

$$V_1 = V_p \cdot C_2/(C_1+C_2)$$

For erasing:

$$V_1 = V_S \cdot C_1/(C_1+C_2)$$

Now assuming that $C_1=C_2$, then $V_1$ is pulled up to half the voltage of the applied voltage $V_p$ during programming. For example, if the voltage required for tunneling is 10 [V], then providing $V_p=20$ [V] during programming allows electrons to tunnel from the high impurity concentration layer 22 (21) through the tunnel oxide film and to be injected into the second floating gate $4B_2$ ($4B_1$); providing $V_S=20$ [V] during erasure allows electrons to tunnel from the second floating gate $4B_2$ ($4B_1$) through the tunnel oxide film and to be pulled out toward the high impurity concentration layer 22 (21).

In the read mode, on the other hand, the transistor for reading (sensing) formed by the drain 3, first floating gate 4A, and source 2 functions instead. This reading transistor can be operated independently of the programming and erasing block formed with the high impurity concentration layers 21 and 22 as described above.

More specifically, by applying a predetermined voltage to the control gate 5 to sense the amount of current (channel current) flowing through the drain 3 and source 2, the threshold voltage for the first floating gate 4A determined by the sum of charges stored on the second floating gates $4B_1$ and $4B_2$ is known, so that the stored information can be read out without using the high impurity concentration layers 21 and 22.

With such an independent read-only transistor, the channel width of that read-only transistor can be reduced, thereby contributing to reduction of power consumption during reading.

Furthermore, the read-only transistor is substantially identical in structure to a typical MOS transistor for EEPROM, such that the drain 3 and first floating gate 4A are very close to each other. That is, the channel length is as short as possible. Thus, any parasitic component (parasitic resistance, parasitic capacitance, etc.) is preferably unlikely to occur between the drain 3 and first floating gate 4A. Especially, parasitic resistance has an adverse effect during reading.

Figure 15:
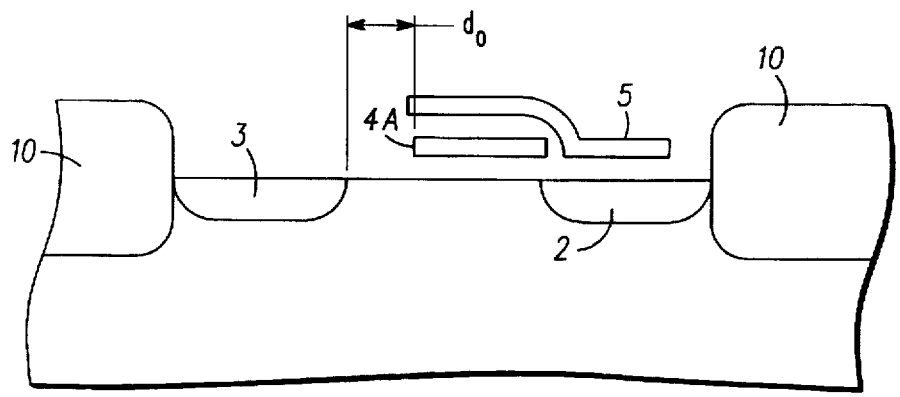
FIG. 15 is a cross-sectional view along $X_2$—$X_2$ based on the assumption that the drain is disposed distally with respect to the first floating gate in the storage cell of FIG. 9.
Figure 16:
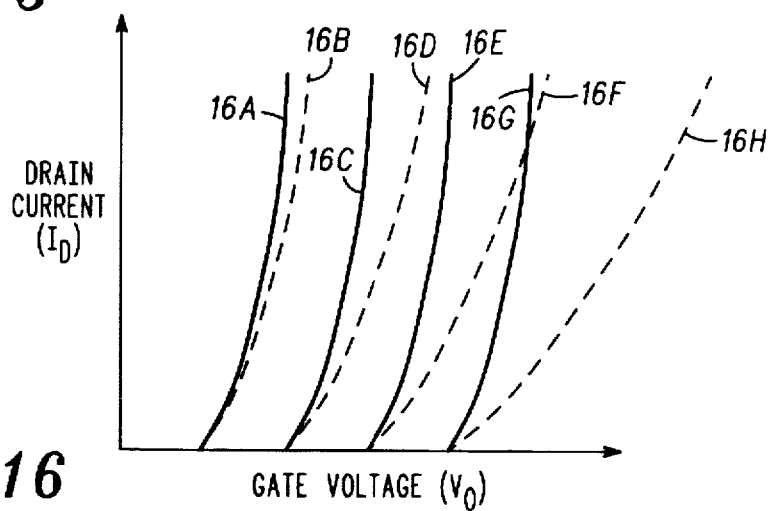
FIG. 16 is a drain current $I_D$ vs. control gate voltage $V_G$ characteristics chart in various storage states for explaining the benefits of the storage cell of FIG. 9.

As shown in FIG. 15, if the drain 3 is separated from the first floating gate 4A by a distance $d_0$, for example, parasitic resistance induced by this distance $d_0$ occurs, so that drain current $I_D$ characteristics relative to the control gate voltage $V_G$ will not retain linearity as indicated by dotted line of FIG. 16. In contrast, the reading transistor formed with the drain 3 with a minimal distance from the first floating gate 4A as shown in FIG. 11 does not produce any parasitic resistance, so that it can retain linearity as indicated by solid line of FIG. 16. In actuality, collapse of linearity due to parasitic resistance would complicate the architecture of a sense amplifier that senses such drain current in the read-out mode. That is because the drain current must be sensed in consideration of nonlinear components.

Small parasitic resistance components translate to improved response of the reading transistor itself, thereby enhancing the read-out speed and reducing power consumption. On the other hand, because the reading transistor is electrically isolated from the program gate, there is another advantage that a problem of so-called "soft erase/write" relative to the second floating gates during read-out will be unlikely to occur.

With the storage cell according to the present embodiment, because programming and erasure is performed by FN tunneling, it is not necessary to conduct a large amount of current as developed by hot carrier injection (HCI), so that power consumption can be reduced and degradation of the oxide film can be minimized, thereby extending the lifetime.

Figure 17:
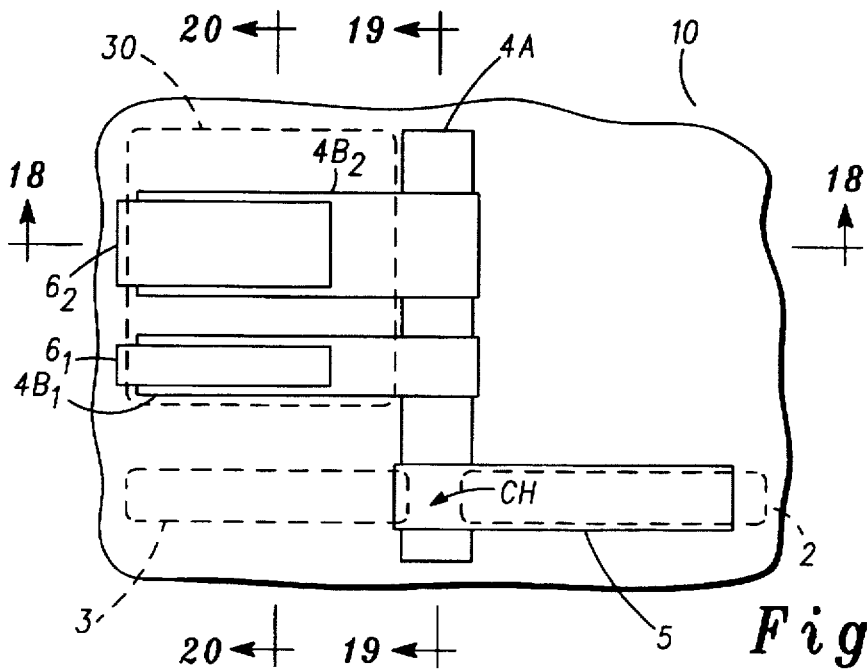
FIG. 17 is a plane view illustrating a storage cell according to another embodiment of the present invention.
Figure 18:
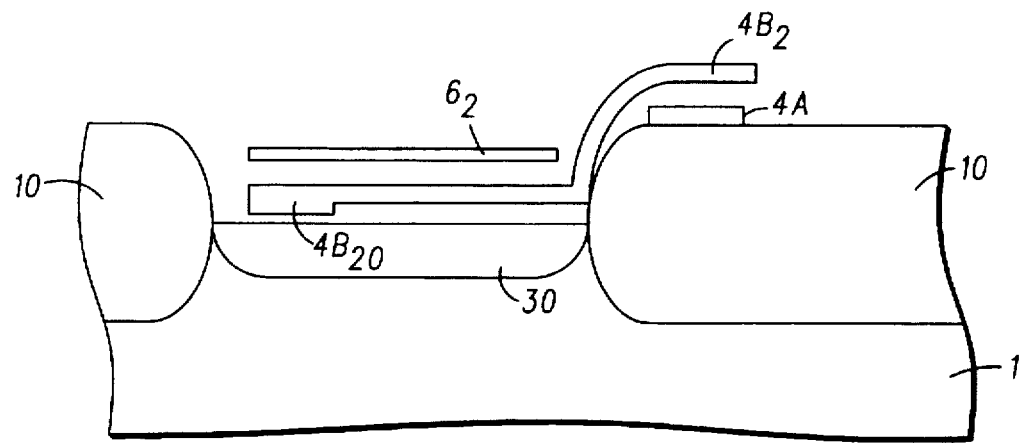
FIG. 18 is a cross-sectional view along $X_3$—$X_3$ of the storage cell of FIG. 17.
Figure 19:
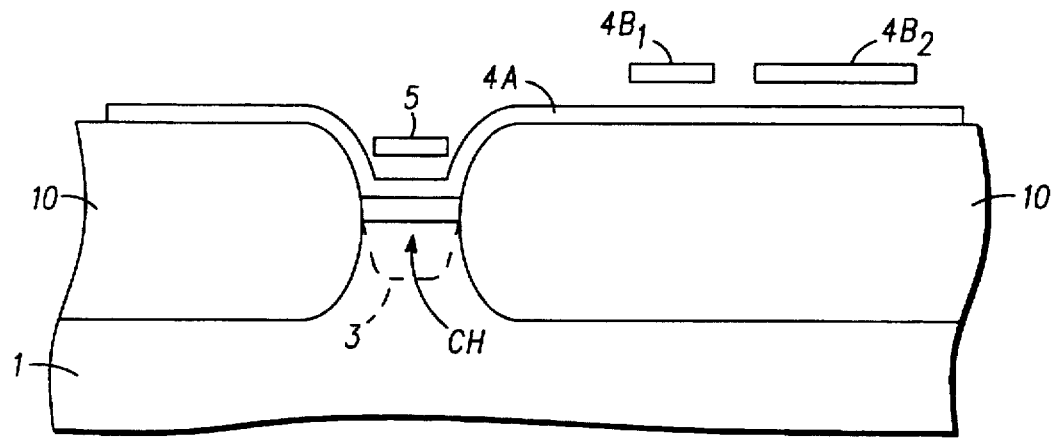
FIG. 19 is a cross-sectional view along $Y_3$—$Y_3$ of the storage cell of FIG. 17.
Figure 20:
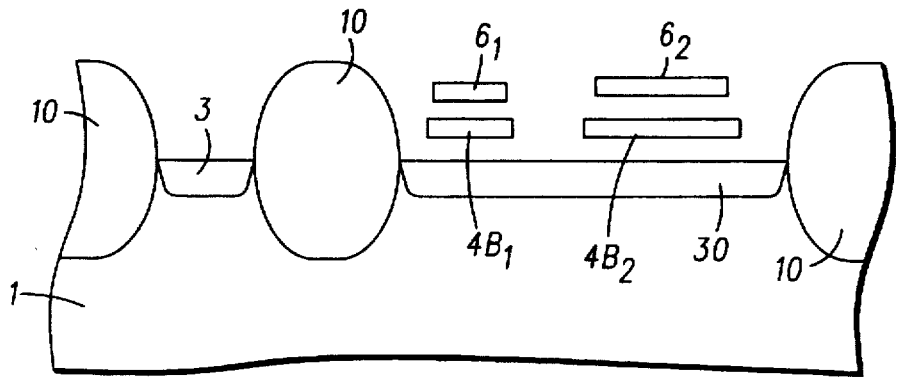
FIG. 20 is a cross-sectional view along $Y_4$—$Y_4$ of the storage cell of FIG. 17.

FIG. 17 is a plane view illustrating a further improved storage cell architecture; FIG. 18 is a cross-sectional view along $X_3$—$X_3$ thereof; FIG. 19 is a cross-sectional view along $Y_3$—$Y_3$ thereof; and FIG. 20 is a cross-sectional view along $Y_4$—$Y_4$ thereof. In those figures, like parts equivalent to those shown in FIGS. 9–13 are denoted by the same reference symbols, and a cross-sectional view along $X_4$—$X_4$ of FIG. 17 is essentially identical to FIG. 11, so it is omitted.

In FIGS. 17–20, a marked difference from the aforedescribed storage cell is that the high impurity concentration layers for programming and erasure are combined into one layer. Such a single high impurity concentration layer 30 for programming and erasure is disposed on the drain 3 side with reference to the first floating gate 4A, onto which second floating gates $4B_1$ and $4B_2$ and program gates $6_1$ and $6_2$ are stacked via an oxide sequentially for each corresponding data bit in a similar manner as in FIGS. 9–13.

For the high impurity concentration layer 30, tunnel oxide film forming regions $4B_{10}$ and $4B_{20}$ are also formed at the edge of the second floating gates $4B_1$ and $4B_2$. The relationship between the field 10 and other gates and high impurity concentration layers is also similar to that shown in FIGS. 9–13.

Such an architecture offers benefits similar to those of the storage cell of FIGS. 9–13, and is additionally advantageous for reducing the areas required for the program and erasure block, i.e., the high impurity concentration layer 30, the second floating gates $4B_1$ and $4B_2$, and the program gates $6_1$ and $6_2$. A common high impurity concentration layer used for both programming and erasure without sandwiching the reading transistor block as shown in FIG. 17 where program and erasure blocks for each bit are grouped in a location would require less space relative to the entire storage cell than individual program and erasure blocks for each bit that are separately disposed with the reading transistor sandwiched as shown in FIG. 9. This would be more effective as the number of bits to be assumed by one storage cell increases.

It should be noted, however, that the storage cell shown in FIG. 9 is erasable for each second floating gate, whereas for the storage cell shown in FIG. 17, erasure is performed once for all the second floating gates by the single high impurity concentration layer 30.

Next, the advantages of a fabrication process for the memory cell according to the present invention are described.

Figure 21:
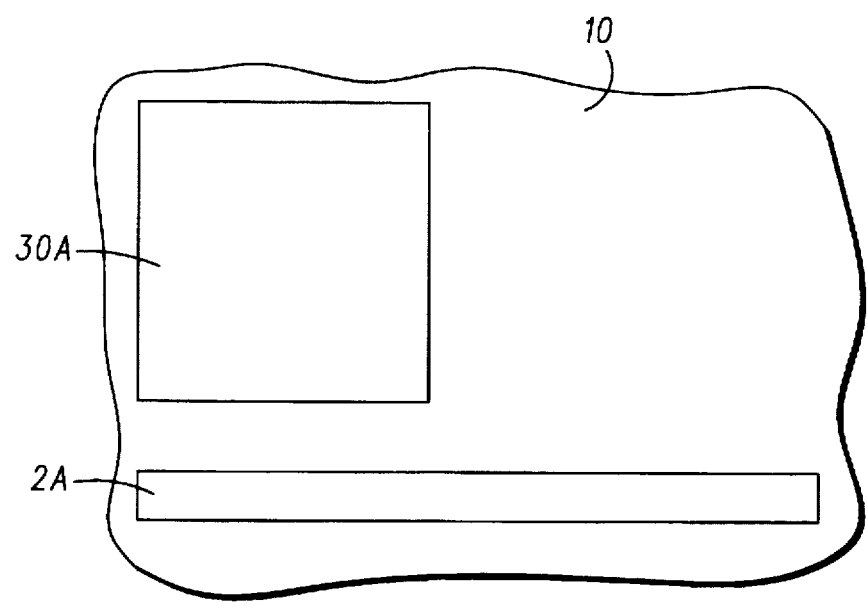
FIG. 21 is a diagram illustrating how the insulating layer is formed in the fabrication process for the storage cell of FIG. 17.
Figure 22:
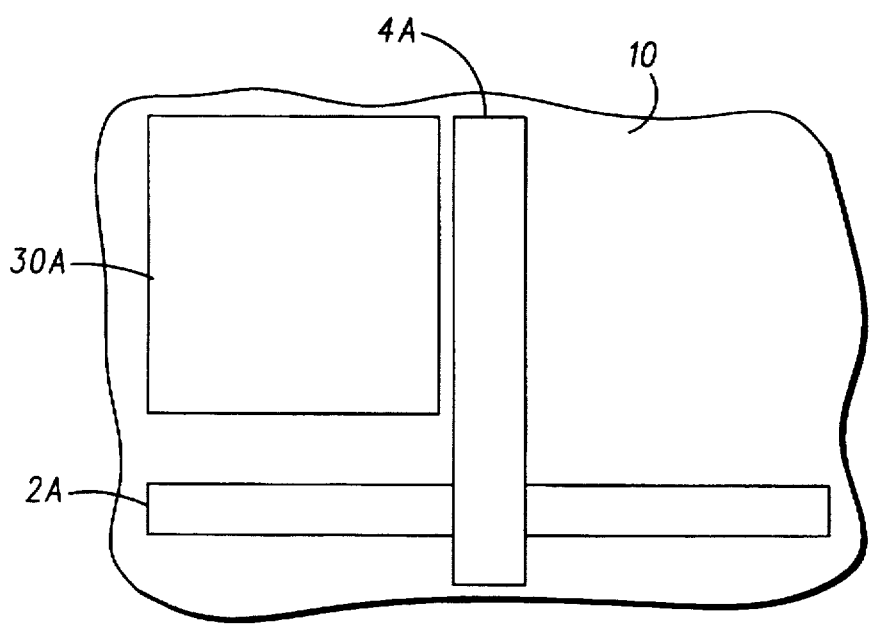
FIG. 22 is a diagram illustrating how the first floating gate is formed in the fabrication process for the storage cell of FIG. 17.
Figure 23:
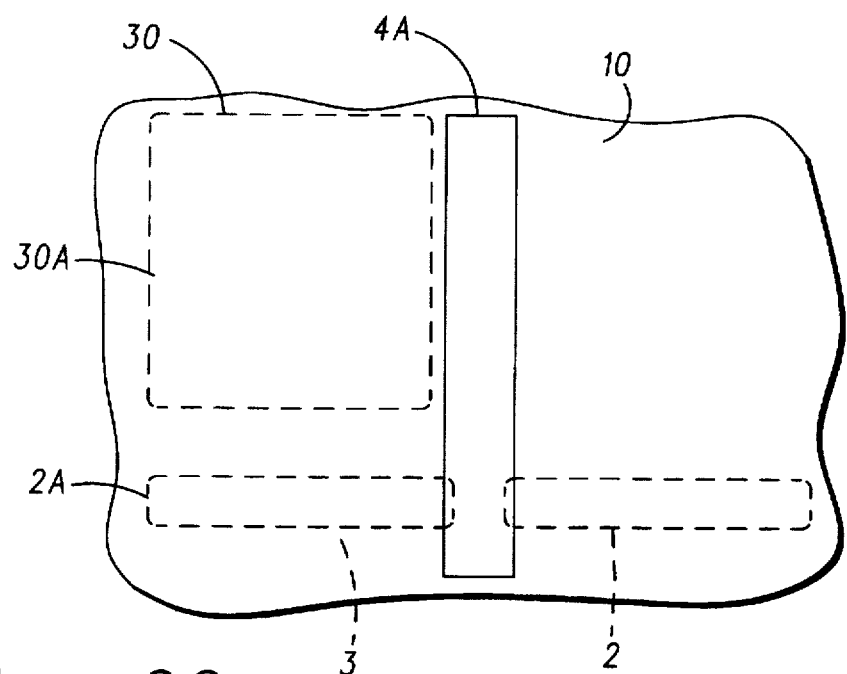
FIG. 23 is a diagram illustrating how the source, drain, and program/erasure high impurity concentration layers are formed in the fabrication process for the storage cell of FIG. 17.

FIGS. 21–24 depicts a fabrication process for the memory cell shown in FIGS. 17–20; as shown in FIG. 21, a field insulation layer 10 is first formed on a semiconductor substrate 1 for each storage cell, and a first floating gate 4A, i.e., a polysilicon gate of the first layer, is then formed as shown in FIG. 22. Then, ion implantation or thermal diffusion is performed in order to form source 2, drain 3 and program/erasure high impurity concentration layer 30 under this condition, as shown in 23. In this way, during the formation of each high impurity concentration layer, the first floating gate 4A serves as a partial mask (a mask for defining the source and drain regions), whereby self-alignment implantation is achieved, so that the edges of the source 2 ad drain 3 that assume the reading transistor, and the first floating gate are well aligned without being offset in structure. In the step of FIG. 23, all the high impurity concentration layers can be formed simultaneously without any mask, thus reducing the number of steps for the entire process.

Figure 24:
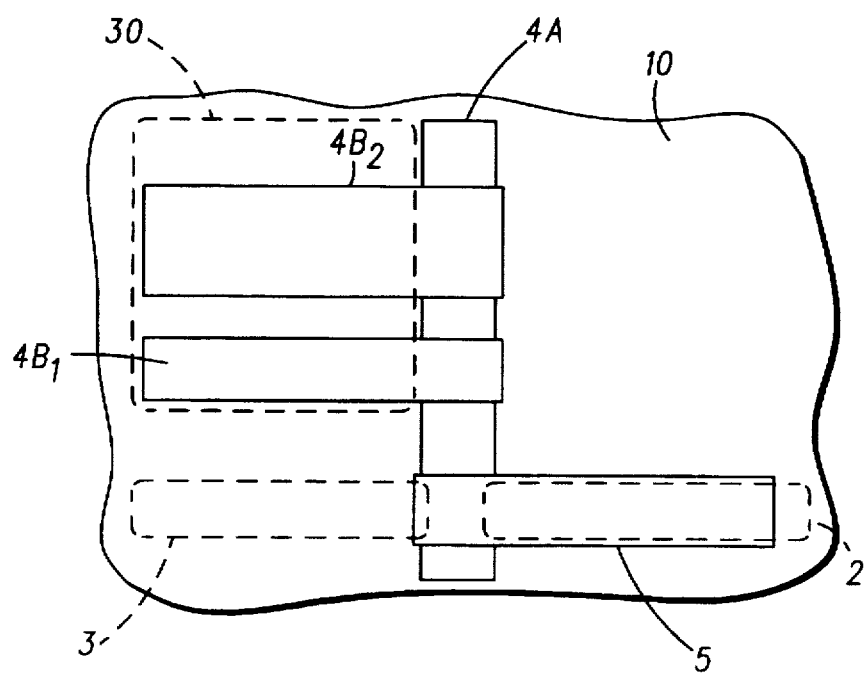
FIG. 24 is a diagram illustrating how the second floating gate and control gate are formed in the fabrication process for the storage cell of FIG. 17.

After the formation of each high impurity concentration layer, polysilicon gates of the second layer, i.e., second floating gates $4B_1$, $4B_2$ and control gate 5 are formed, as shown in FIG. 24. Finally, as shown in FIG. 17, the polysilicon gates of the third layer, i.e., the program gates $6_1$ and $6_2$, are disposed over the second floating gates $4B_1$ and $4B_2$ to complete the principal fabrication process steps for the storage cell.

The individually erasable storage cell shown in FIGS. 9–13 may be also fabricated in a similar manner, so the edges of the source 2 and drain 3 that assume the reading transistor can be well aligned with the first floating gate 4A without being offset in structure. It should be noted, however, that such an individually erasable storage cell require high impurity concentration layers for program/ erasure to be formed individually, thus calling for a more finer processing technique.

Thus, the storage cell according to the present invention can be fabricated by adopting the existing techniques in the field formation step, in the high impurity concentration layer formation step, and in the polysilicon gate formation step, so that simple fabrication process steps can be retained, while contributing to improved yield and reduced cost.

In each example described above, the number of second floating gates is two, but three or more floating gates may be employed. In that case, the first floating gate may be further extended in the direction W in FIG. 9, and each of the second floating gates may be changed in size along the direction W and arranged in conjunction with the program gate and high impurity concentration layer that form a pair therewith. Also in FIG. 17, the first floating gate and high impurity concentration layer may be further extended in the direction W, and each of the second floating gates may be changed in size along the direction W and arranged in conjunction with the program gate that forms a pair therewith. In that case, too, programming as described above may be similarly performed for each of the second floating gates.

Furthermore, although the reading transistor has been formed at the center of the storage cell, it is not limited thereto, but may be formed in any location as far as it is formed separately from the program/erasure high impurity concentration layers and also as far as a reading transistor can be fabricated which comprises a source and drain that extend adjacent to the first floating gate, the first floating gate, and the control gate.

Additionally, in the above embodiment, it has been described that the semiconductor substrate 1 is p-type silicon; however, it is not limited thereto, but n-type or other semiconductors may also be used. In addition, the program/erasure high impurity concentration layers, floating gates, program gates, control gates and other oxides, as well as the source and drain, may be formed in various shapes with various kinds of materials; thus, the present invention may be altered or modified without departing from the scope of the invention that may be designed by those skilled in the art.

As described in detail above, according to the present invention, a non-volatile memory and its program/erasure/reading method can be provided that can contribute to increased memory capacity and allows for reduced power consumption and extended lifetime, while suitable for a simplified fabrication process.

What is claimed is:

1. A non-volatile memory having memory cells, each memory cell being double layered floating gate multi bit memory cell, the memory cell comprising:

source and drain being distant from each other along a predetermined first direction in a semiconductor substrate;

a single first floating gate being provided between the source and the drain and above a principal plane of the semiconductor substrate and extending along a second direction, the second direction being different from the first direction;

a control gate being placed between the source and the drain and above a principal plane of the first floating gate;

at least one high impurity concentration layer being isolated from the source and drain in the semiconductor substrate;

a plurality of second floating gates overlaying the first floating gate and at least a portion of the high impurity concentration layer; and a plurality of program gates being placed above at least a portion of the principal planes of the second floating gates.

2. A non-volatile memory of claim 1, wherein the second floating gates have areas which are different from each other.

3. A non-volatile memory of claim 1, wherein the oxide thickness between said second floating gates and said first floating gate are different.

4. A non-volatile memory of claim 1, wherein the high impurity concentration layers are formed in number corresponding to the the second floating gates.

5. A non-volatile memory of claim 1, wherein the memory cell further has an insulation layer that electrically isolates the source and drain and the high impurity concentration layer.

6. A non-volatile memory of claim 1, wherein a tunnel oxide film forming region comprising an oxide film having a predetermined thickness between the second floating gate and the high impurity concentration layer.

7. A non-volatile memory of claim 1, wherein a reading transistor block is formed by the source and drain, the first floating gate, and the control gate, and wherein programming and erasing blocks are formed by the high impurity concentration layers, the second floating gates, and the program gates.

8. A non-volatile memory of claim 2, wherein the high impurity concentration layers are formed in number corresponding to the the second floating gates.

9. A non-volatile memory of claim 2, wherein the memory cell further has an insulation layer that electrically isolates the source and drain and the high impurity concentration layer.

10. A non-volatile memory of claim 2, wherein a reading transistor block is formed by the source and drain, the first floating gate, and the control gate, and wherein programming and erasing blocks are formed by the high impurity concentration layers, the second floating gates, and the program gates.

11. A non-volatile memory of claim 2, wherein a reading transistor block is formed by the source and drain, the first floating gate, and the control gate, and wherein programming and erasing blocks are formed by the high impurity concentration layers, the second floating gates, and the program gates.

12. A non-volatile memory of claim 3, wherein the high impurity concentration layers are formed in number corresponding to the the second floating gates.

13. A non-volatile memory of claim 3, wherein the memory cell further has an insulation layer that electrically isolates the source and drain and the high impurity concentration layer.

14. A non-volatile memory of claim 3, wherein a tunnel oxide film forming region comprising an oxide film having a predetermined thickness between the second floating gate and the high impurity concentration layer.

15. A non-volatile memory of claim 3, wherein a reading transistor block is formed by the source and drain, the first floating gate, and the control gate, and wherein programming and erasing blocks are formed by the high impurity concentration layers, the second floating gates, and the program gates.

16. A non-volatile memory of claim 4, wherein the memory cell further has an insulation layer that electrically isolates the source and drain and the high impurity concentration layer.

17. A non-volatile memory of claim 4, wherein a tunnel oxide film forming region comprising an oxide film having a predetermined thickness between the second floating gate and the high impurity concentration layer.

18. A method for programming to the non-volatile memory of claim 7, the method characterized by:

applying a predetermined program voltage between the program gate corresponding to the second floating gate to be programmed and the high impurity concentration layer, and tunneling electrons generated thereby from the high impurity concentration layer into an intermediate material between the high impurity concentration layer and the program gate, thereby injecting the electrons into the second floating gate.

19. A method for erasing data of the non-volatile memory of claim 7, the method characterized by:

applying a predetermined erase voltage between the program gate corresponding to the second floating gate to be erased and the high impurity concentration layer, and tunneling electrons generated thereby from the second floating gate into an intermediate material between the high impurity concentration layer and the program gate, thereby injecting the electrons into the high impurity concentration layer.

20. A method for reading a data of the non-volatile memory of claim 7, the method characterized by:

applying a predetermined bias voltage to the control gate to detect a channel current generated between the source and drain.

* * * * *